United States Patent [19]

Le Coz et al.

[11] 4,095,197

[45] June 13, 1978

[54] PROPAGATION TIME EQUALIZER FOR CIRCULAR WAVE GUIDES

[75] Inventors: Gérard Le Coz, St Cheron; Jean-Noel Marchalot, St Michel sur Orge, both of France

[73] Assignee: Compagnie Industrielle des Telecommunications Cit-Alcatel S.A., Paris, France

[21] Appl. No.: 765,331

[22] Filed: Feb. 3, 1977

[30] Foreign Application Priority Data

Feb. 3, 1976 France ................................ 76 02921

[51] Int. Cl.$^2$ .......................... H01P 1/20; H03H 7/14

[52] U.S. Cl. ................................ 333/28 R; 333/31 A

[58] Field of Search ............................ 333/28 R, 31 A

[56] References Cited

U.S. PATENT DOCUMENTS

| | | | |
|---|---|---|---|
| 2,639,326 | 5/1953 | Ring | 333/28 R |
| 4,034,315 | 7/1977 | Unrau | 333/10 |

FOREIGN PATENT DOCUMENTS

| | | | |
|---|---|---|---|
| 1,236,336 | 6/1971 | United Kingdom | 333/28 R |

*Primary Examiner*—Paul L. Gensler

*Attorney, Agent, or Firm*—Sughrue, Rothwell, Mion, Zinn and Macpeak

[57] ABSTRACT

The input wave guides are oriented towards a perpendicular output wave guide with a semi-reflecting quarter-wave plane reflector disposed at 45° to two progressive reflectors which cause increasing delay with frequency and which are disposed in the line of the input and output wave guides.

3 Claims, 2 Drawing Figures

PROPAGATION TIME EQUALIZER FOR CIRCULAR WAVE GUIDES

FIELD OF THE INVENTION

The present invention relates to a propagation time equalizer for circular wave guides.

BACKGROUND OF THE INVENTION

Circular wave guides are used in telecommunications; they have an internal conductive surface in the form of a cylinder of revolution through which electromagnetic waves propagate at various frequencies, lying conventionally between 30 and 100 Ghz.

Signals can thus be transmitted over long distances with a very wide pass-band. Unfortunately, these signals are progressively distorted because the propagation velocity of their various components increases with their frequency. This propagation velocity is indeed the group velocity of the waves in the guide, it being known that this velocity is different from the phase velocity and that it increases with the frequency. To obtain signals without distortion, it is therefore necessary to place delay equalizers in the signal transmission circuit. Such an equalizer should delay the various components of the signals, the delay increasing with frequency to compensate the advance acquired by the high-frequency components in the guide.

Delay equalizers are known for rectangular wave guides. These equalizers using a set of guides connected together and forming a conventional device called a "hybrid T" and constituted by four arms: an input arm, an output arm perpendicular to the input arm and two lateral arms alined perpendicular to the input arm and to the output arm. There is a difference of a quarter of a wavelength between the lengths of these lateral arms and each of them is terminated with a "progressive reflector", i.e. at a guide having a decreasing cross-section. The function of this progressive reflector is to reflect the waves which penetrate therein after they have travelled along a path which increases with their frequency. It is known that in these conditions the waves arriving through the input arm are transmitted to the output arm with a delay which increases with their frequency because the higher frequency waves have travelled along a longer path in the progressive reflectors.

Such a delay equalizer for a rectangular wave guide can be used with circular wave guides only in conjunction with transition elements between the circular wave guides and rectangular wave guides. Such transition elements make the telecommunications devices more complex and more expensive.

It is also known to produce delay equalizers for circular wave guides, which transpose the frequency of the waves propagated in the guides so as to obtain signals at much lower frequencies (medium frequency) which can be handled by conventional electronic circuits. These electronic circuits are designed to delay the various components of the signals by amounts which are greater for components transmitted along the transmission line at higher frequencies. Such circuits are complex and expensive.

Preferred embodiments of the present invention provide cirular wave guide delay equalizers which are simple to manufacture.

SUMMARY OF THE INVENTION

The present invention provides a delay equalizer for a circular wave guide comprising a circular input wave guide;

A circular output wave guide having the same diameter as the input wave guide is connected to the input wave guide by a common end, the axes of these two guides meeting at an angle.

A first progressive reflector constituted by a circular wave guide whose input diameter is equal to that of the input wave guide and the output wave guide and whose cross-section decreases from its input so that the waves which enter the first progressive reflector will be reflected after having travelled along a path which is longer for increasing frequency is placed in the line of the input wave guide beyond said common end to which it is connected by its input.

A second progressive reflector identical to the first is placed in the line of the output wave guide beyond said common end to which it is connected by its input.

A plane semi-reflecting plate of the "quarter-wave" type occupies the interior cross-section of said wave guides at their common end and is disposed so that the axis of the input wave guide will be symmetrical to the axis of the output wave guide in relation to this plate.

The material and the thickness of this plate is chosen so that it will let pass half the energy of the waves which it receives with a phase shift of a quarter of a wavelength and so that it will reflect the other half of this energy.

An embodiment of a delay equalizer according to the invention and having no limiting character is described hereinbelow with reference to the accompanying drawings.

DESCRIPTION OF THE PREFERRED EMBODIMENT

Figure 1:
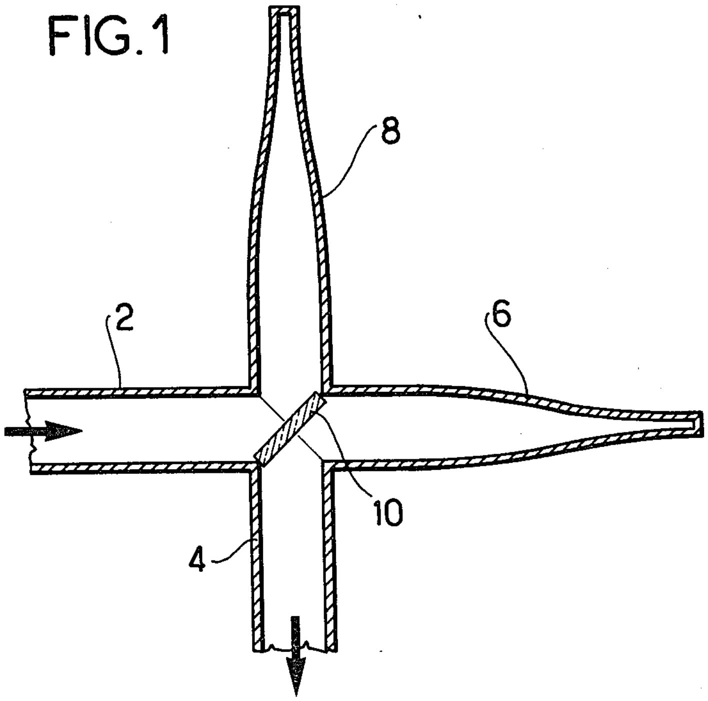
FIG. 1 is a cross-section of a plan view passing through the axes of the input wave guide and of the output wave guide of a delay equalizer.

In FIG. 1, an input wave guide 2 with a circular cross-section of 50 mm diameter is connected at right-angles to an outlet wave guide 4 having the same cross-section, the plane of the figure passing through the axes of the two wave guides.

A first progressive reflector 6 and a second progressive reflector 8 are disposed coaxially in line with the input wave guide 2 and the output wave guide 4, respectively; being connected by their inputs to the common end of these two wave guides. These progressive reflectors are identical to each other and are each constituted by a circular wave guide whose input cross-section is equal to that of the wave guides 2 and 4. Their cross-section then decreases progressively.

It is possible for example to determine the law of variation of diameter D of the reflector as a function of the distance $x$ from the input by the following hypothesis:

$To(f) + Tr(f) =$ constant in the frequency band in question where $To(f)$ is the propagation time in the line whose delay is to be equalized $Tr(f)$ is the propagation time in the reflector $f$ is the frequency in question.

and wherein:

$$To(f) = \frac{Lo}{c} \frac{1}{\sqrt{1 - \left(\frac{nc}{Pof}\right)^2}}$$

$$Tr(f) = \frac{1}{c} \int_o^{x1} \frac{dx}{\sqrt{1 - \left(\frac{nc}{P(x)f}\right)^2}}$$

where:

$n$ is the square root of the Bessel function characterizing the mode of propagation used.

$c$ is the velocity of light in a vacuum;

$Po$ is the interior perimeter of the cross-section of the circular wave guide whose delay is to be equalized, i.e. its diameter multiplied by the number $\pi$;

Lo is the length of the circular wave guide whose delay is to be equalized;

$P(x)$ is the interior perimeter of the circular cross-section of the reflector at the point situated at the distance $x$ from the input of the reflector; and $x1$ is the limiting distance from the input of the reflector for the frequency and mode being considered.

A flat plate 10 is disposed at the common end of the wave guides 2 and 4. This plate is a semi-reflecting plate, i.e. it reflects half the energy of the waves it receives and it is of the "quarter wave" type, i.e. it transmits the other half of this energy by causing a phase shift of a quarter of the wavelength. This is a property of the choice of the material from which it is made, e.g. glass and of its thickness in the direction of propagation of the waves, e.g. 0.5 mm. Its plane is perpendicular to the plane of the figure and forms an angle of 45° with the axes of the wave guides 2 and 4. It is disposed so that the waves arriving through the input wave guide 2 will be partly reflected towards the second progressive reflector 8. These waves are also partly transmitted towards the first progressive reflector 6 with a phase shift of a quarter of the wavelength.

The waves received by the two progressive reflectors are reflected with a delay which increases with their frequency. Those which are reflected by the reflector 6 are then partly reflected by the plate 10 towards the output wave guide 4 and partly transmitted towards the input wave guide 2. Those which are reflected by the reflector 8 are then partly reflected by the plate 10 towards the input wave guide 2 and partly transmitted towards the output wave guide 4. Concerning the input wave guide 2, the waves coming from the reflectors 6 and 8 have the same amplitude and are in phase opposition, since one set has passed twice through the plate 10 and the other set has been reflected twice without any phase shift. Hence no energy is reflected into the input wave guide 2. As far as concerns the output wave guide 4, the waves coming from the reflectors 6 and 8 are in phase coincidence. Hence, neglecting the losses, all the energy arriving through the input wave guide 2 is found in the output wave guide 4. The only modification which the waves undergo is that the higher frequency components have undergone a longer delay in the reflectors 6 and 8.

In the case where the propagation times in very long wave guides, e.g. wave guides of 500 m have to be equalized with a delay equalizer according to the invention, circumstances lead to the use of long progressive reflectors, e.g. having a length of 2.8 m, which would increase the bulk of the delay equalizer very inconveniently.

Figure 2:
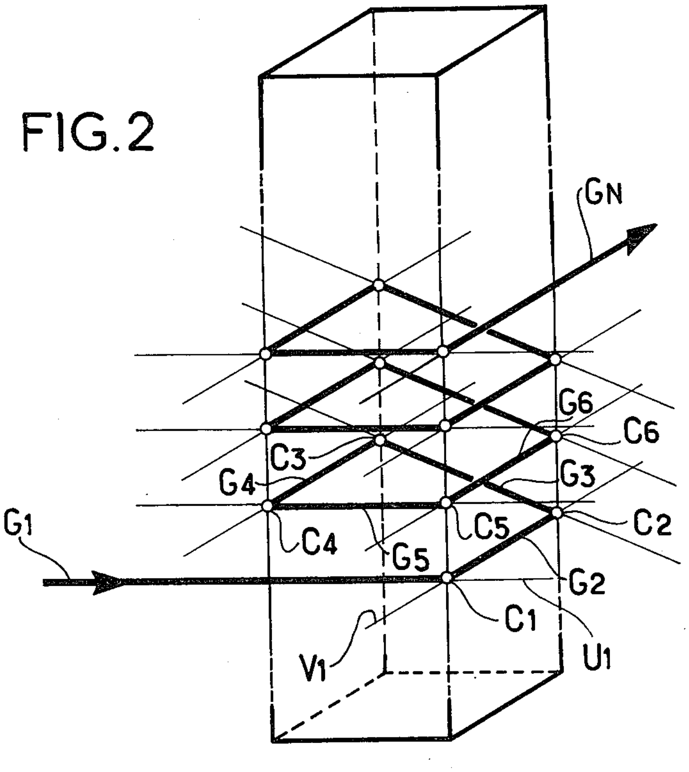
FIG. 2 is a perspective view of a delay equalizer device constituted by several delay equalizers connected in series.

That is why it can be useful to connect several such delay equalizers in series so that the lengths of the progressive reflectors will be superposed. If the lengths of the progressive reflectors of a single delay equalizer are L, the lengths of the progressive reflectors of N identical delay equalizers connected in series and providing the same corrections will be only L/N. It is possible for example to use the disposition shown in FIG. 2, in which the wave guide is drawn in thick lines and the progressive reflectors are drawn in thin lines. The outlet wave guide of the delay equalizer constitutes the input wave guide of the following delay equalizer and there is an angle of 90° between the input wave guides of two consecutive delay equalizers.

The successive delay equalizers are designated by the letter C followed by the order number of the delay equalizer. The corresponding input wave guides are designated by the letter G followed by this order number and the first and second corresponding progressive reflectors are designated respectively by the letters U and V.

An input wave guide G1 is horizontal. It constitutes the input wave guide of a first delay equalizer C1 provided with progressive reflectors U1 and V1. The input wave guide G2 of the second delay equalizer C2 is also horizontal. The input wave guide G3 of the third delay equalizer C3 is inclined with respect to the horizontal so that the delay equalizer C3 will be higher than the delay equalizer C2.

The wave guide G3 is horizontal. The lengths of the wave guides G2 and G4 are equal and the delay equalizers are oriented so that the delay equalizer C4 will be disposed exactly above the wave guide G1, the successive input wave guides rotating always in the same direction, e.g. anticlockwise. The wave guide G5 is horizontal, the delay equalizer C5 being disposed above the delay equalizer C1. The wave guide G6 is horizontal, the delay equalizer C6 being disposed above the delay equalizer C2. In general, the delay equalizers are regularly spaced out on four vertical straight lines forming the edges of a prism having a rectangular cross-section round which the wave guides wind always in the same direction, the superposed wave guides being parallel to one another. This disposition makes it possible to connect in series a great number of delay equalizers according to the invention with a minimum bulk. The last wave guide GN is constituted by the output wave guide of the last delay equalizer.

What we claim is:

1. A delay equalizer for a circular wave guide comprising:

a circular input wave guide;

a circular output wave guide having the same diameter as the input wave guide and being connected to the input wave guide by a common end with the axes of these two wave guides meeting at an angle;

a first progressive reflector constituted by a circular wave guide whose input diameter is equal to that of the input wave guide and the output wave guide and whose cross-section decreases from its input so that the waves which enter the first progressive reflector will be reflected after having travelled along a path which is longer for increasing frequency, said first progressive reflector being placed in the line of the input wave guide beyond said common end and being connected thereto by its input;

a second progressive reflector identical to the first reflector and placed in the line of the output wave guide beyond said common end and being connected thereto by its input; and a plane semi-reflecting plate of the "quarter wave" type occupying the interior cross-section of said wave guides at their common end and being disposed so that the axis of the input wave guide will be symmetrical to the axis of the output wave guide in relation to this plate, the material and the thickness of this plate being chosen so that it passes half the energy of the waves which it receives with a phase shift of a quarter of a wavelength and reflects the other half of this energy.

2. A delay equalizer according to claim 1, wherein the axes of said input wave guide and output wave guide meet at right-angles.

3. A delay equalizer assembly for a circular wave guide comprising a series connection of a plurality of equalizers each of said equalizers comprising:

a circular input wave guide;

a circular output wave guide having the same diameter as the input wave guide and being connected to the input wave guide by a common end with the axes of these two wave guides meeting at an angle;

a first progressive reflector constituted by a circular wave guide whose input diameter is equal to that of the input wave guide and the output wave guide and whose cross-section decreases from its input so that the waves which enter the first progressive reflector will be reflected after having travelled along a path which is longer for increasing frequency, said first progressive reflector being placed in line of the input wave guide beyond said common end and being connected thereto by its input;

a second progressive reflector identical to the first reflector and placed in the line of the output wave guide beyond said common end and being connected thereto by its input; and a plane semi-reflecting plate of the "quarter wave" type occupying the interior cross-section of said wave guides at their common end and being disposed so that the axis of the input wave guide will be symmetrical to the axis of the output wave guide in relation to this plate, the material and the thickness of this plate being chosen so that it passes half the energy of the waves which it receives with a phase shift of a quarter of a wavelength and reflects the other half of this energy.

* * * * *